United States Patent

Neville, Jr. et al.

[11] Patent Number: 6,021,044
[45] Date of Patent: Feb. 1, 2000

[54] HEATSINK ASSEMBLY

[75] Inventors: Robert J. Neville, Jr., Mendon; Daniel Hodgkins, Milford, both of Mass.

[73] Assignee: Data General Corporation, Westboro, Mass.

[21] Appl. No.: 09/133,219

[22] Filed: Aug. 13, 1998

[51] Int. Cl.$^7$ ................................................... H05K 7/20
[52] U.S. Cl. .................... 361/700; 165/104.33; 174/15.2
[58] Field of Search ................................. 165/80.2, 80.4, 165/104.26, 104.33, 908; 174/15.2; 257/714–715, 718–719; 361/687–690, 701, 703, 704, 707, 709, 710

[56] References Cited

U.S. PATENT DOCUMENTS

| | | | |
|---|---|---|---|
| 5,095,404 | 3/1992 | Chao . | |
| 5,208,731 | 5/1993 | Blomquist | 361/704 |
| 5,339,214 | 8/1994 | Nelson | 361/700 |
| 5,396,402 | 3/1995 | Perugini et al. | 361/704 |
| 5,549,155 | 8/1996 | Meyer, IV et al. | 165/104.33 |
| 5,826,645 | 10/1998 | Meyer, IV et al. | 165/104.33 |

*Primary Examiner*—Gregory Thompson
*Attorney, Agent, or Firm*—Kriegsman & Kriegsman

[57] ABSTRACT

A heatsink assembly for removing at least some of the heat produced by an electronic component during use includes a heatsink, a heatpipe mounted on the heatsink and a plurality of thin, elongated fins mounted on the heatpipe. The heatsink is an elongated, generally rectangularly-shaped body and comprises a bottom surface, a top surface and a central, cylindrical channel formed in the top surface. A pair of clip recesses are formed in the top surface of the heatsink on opposite sides of the central channel. A first set of thin, elongated fins and a second set of thin, elongated fins are also formed in the top surface of the heatsink and serve to remove at least some of the heat transferred onto the heatsink. The heatpipe comprises an evaporator section and a condenser section. The evaporator section of the heatpipe is disposed tightly within the central channel of the heatsink so as to maximize the transfer of heat from the heatsink to the heatpipe. The plurality of thin, elongated fins are disposed on the condenser section of the heatpipe in a closely spaced parallel relation and serve to remove at least some of the heat transferred onto the heatpipe.

17 Claims, 2 Drawing Sheets

HEATSINK ASSEMBLY

BACKGROUND OF THE INVENTION

The present invention relates generally to electronic components and, more particularly, to electronic component assemblies which include an electronic component and a heatsink, the heatsink being mounted on the electronic component to remove at least some of the heat produced by the electronic component during use.

Electronic components, such as integrated circuit (IC) chip packages, are well known and commonly used in the art to perform electronic functions. Integrated circuit chips are often manufactured in dual-in-line (DIP) leaded packages which can be through-hole or surface mounted on a printed circuit board or a surface-mountable chip carrier.

In use, it has been found that IC chip packages often produce significant levels of heat. In particular, as integrated circuit technology has advanced the density of IC chips, it has been found that the amount of heat produced by the IC chips has increased appreciably. The increased levels of heat produced by IC chips during use introduces numerous problems. For example, increased levels of heat produced by an integrated circuit chip can potentially cause the IC chip to malfunction.

As a consequence, various methods have been employed in the art to cool integrated circuit chips. One well-known method for cooling integrated circuit chips involves blowing air across the IC chip using either a fan or a blower.

Another well-known method for cooling integrated circuit chips involves mounting a small channel-shaped or fin-shaped heatsink on the top surface of each IC chip. Heatsinks are typically manufactured of a highly, thermally conductive metal, such as aluminum, and are mounted on the top surface of the integrated circuit chip to dissipate heat produced by the IC chip during use by means of thermal conduction. Heatsinks typically comprise a plurality of parallel fins which are mounted on a base and which serve to facilitate the radiation and convection of the conducted heat. Often a fan or blower will be used to help cool the parallel fins.

Heatsinks are often mounted on the surface of electronic components using a thermally conductive epoxy, such as a silicon compound. However, the use of a thermally conductive epoxy to mount a heatsink onto the surface of an electronic component is a significantly complex manufacturing procedure, which thereby increases the overall cost and complexity of manufacturing. For example, it has been found that there is a considerable level of difficulty in depositing an epoxy layer of uniform thickness between the electronic component and the heatsink. Furthermore, the heatsink and the electronic component must be pressed together with a certain amount of pressure for a certain amount of time in a certain orientation, which further increases the complexity of manufacturing.

Heatsinks have also been mounted on the surface of electronic components using an elongated, generally C-shaped, spring-biased metal clip, the clip having a first end, a second end and a central member between the two ends. Each end is shaped to include a mounting hole. In use, the mounting hole at the first end of the spring biased metal clip is lockably engaged onto a finger at one side of a socket on which the electronic component is mounted. The central member of the spring clip extends longitudinally over the parallel fins and the mounting hole at the second end is lockably engaged to a finger on an opposite side of the socket on which the electronic component is mounted. As such, the central member of the clip applies a downward pressure onto the heatsink, thereby forcing the heatsink down against the electronic component, as desired.

It should be noted that the prior art techniques for cooling IC chips that were noted above have found to be inadequate for cooling high density integrated circuit chips. Specifically, high density integrated circuit chips are often mounted on a printed circuit board which, in turn, is disposed within a relatively confined area of an electronic system.

Due to the relatively confined space in which the high density IC chip is disposed, it has been found that inadequate air flow is able to cool the IC chip to efficiently remove the relatively large amount of heat produced by the relatively small sized IC chip. In addition, the relatively small surface area of high density IC chips does not lead itself to physically mounting a heat sink thereon, especially a heatsink of the size that would be necessary to handle the heat generated. Furthermore, the high density IC chip is often disposed in a relatively confined space and in close proximity to other high density IC chips. The positioning of the high density IC chip in close proximity to other IC chips can create a shadowing effect in which the heat produced by neighboring IC chips is transferred to the high density IC chip, thereby increasing the total amount of heat produced by the IC chip.

Accordingly, it is an object of this invention to provide a new and improved heatsink assembly.

It is another object of this invention to provide a heatsink assembly which removes at least some of the heat produced by an electronic component during use.

It is yet object of this invention to provide a heatsink assembly of the type described above which is relatively small in size and which can fit within a relatively confined area.

It is still another object of this invention to provide a heatsink assembly of the type described above which has a limited number of parts, which is inexpensive to manufacture and which is easy to use.

SUMMARY OF THE INVENTION

Accordingly, there is provided a heatsink assembly for removing at least some of the heat produced by an electronic component during use, said heatsink assembly comprising a heatsink having a bottom surface, a top surface and a central channel formed in the top surface, a heatpipe having an evaporator section and a condenser section and a plurality of fins mounted on the condenser section of the heatpipe, the evaporator section of said heatpipe being disposed tightly within the central channel of said heatsink so as to maximize the transfer of heat from said heatsink to said heatpipe.

Various other features and advantages will appear from the description to follow. In the description, reference is made to the accompanying drawings which form a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts and wherein.

DETAILED DESCRIPTION OF THE PREFERRED EMBODIMENT

Figure 1:
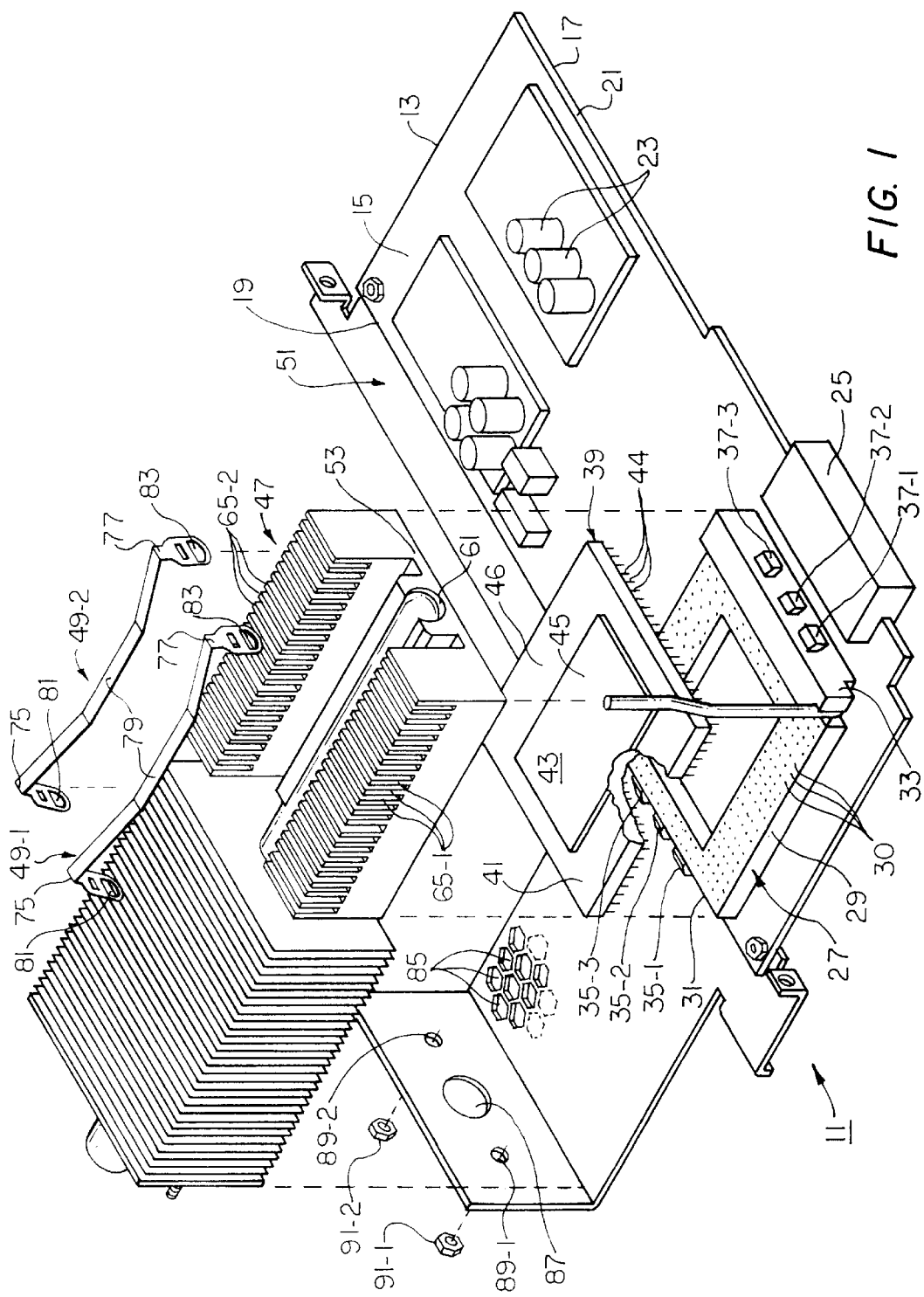
FIG. 1 is a partially exploded top perspective view of a printed circuit board assembly constructed according to the teachings of the present invention.
Figure 2:
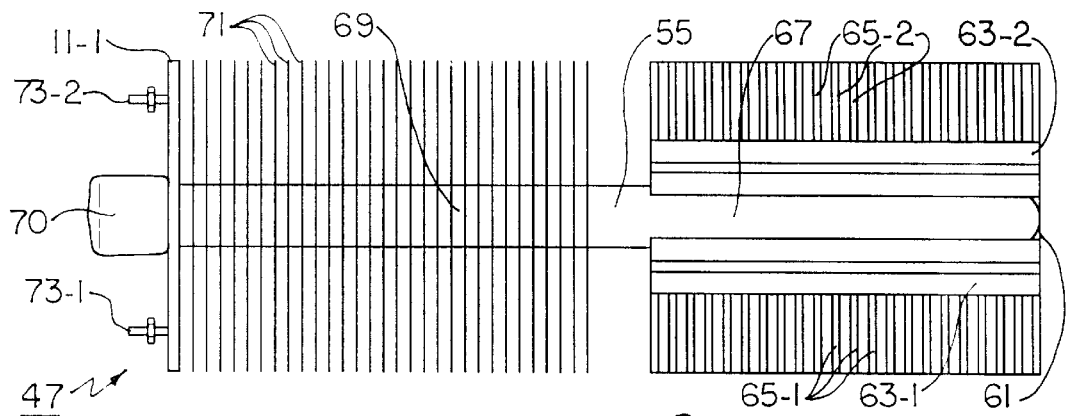
FIG. 2 is a front view of the heatsink assembly shown in FIG. 1.
Figure 3:
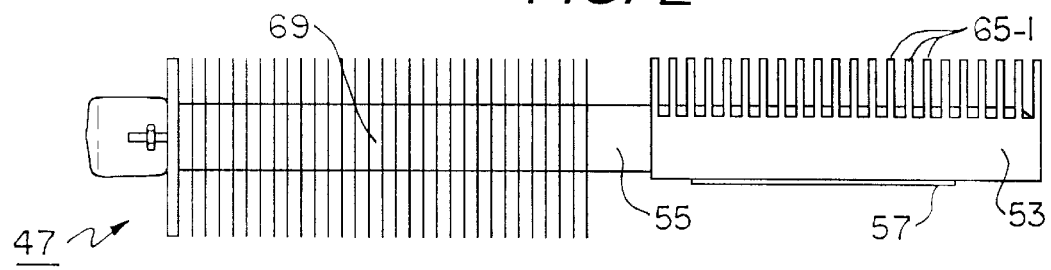
FIG. 3 is a left side view of the heatsink assembly shown in FIG. 1.
Figure 4:
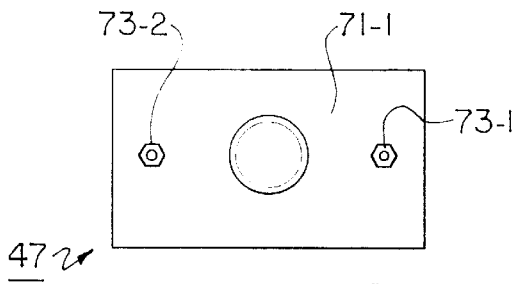
FIG. 4 is a top view of the heatsink assembly shown in FIG. 1.
Figure 5:
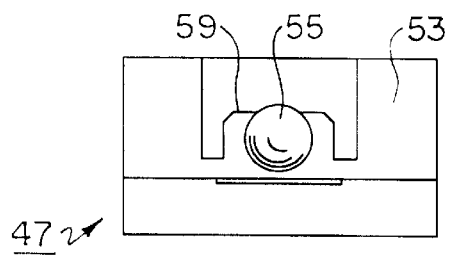
FIG. 5 is a bottom view of the heatsink assembly shown in FIG. 1.
Figure 6:
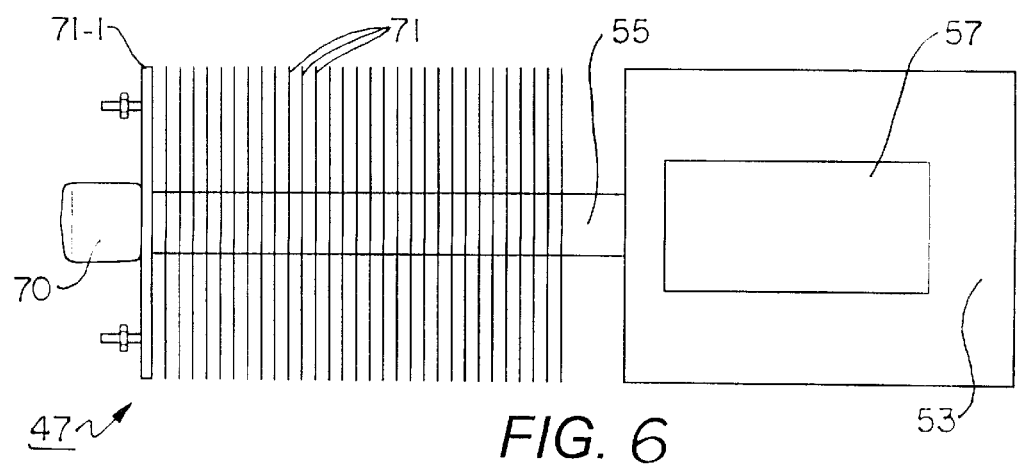
FIG. 6 is a rear view of the heatsink assembly shown in FIG. 1.

Referring now to FIGS. 1–6 and first to FIG. 1 a printed circuit board assembly constructed according to the teachings of the present invention, the printed circuit board assembly being identified generally by reference numeral 11.

Printed circuit board assembly 11 comprises a printed circuit board 13 having a top surface 15, a bottom surface 17, a top edge 19 and a bottom edge 21. Printed circuit board 13 represents any circuit board which is well known in the art. A plurality of electrical components 23, which represent any type of well-known electrical component (i.e., capacitors, resistors and/or transformers), are shown mounted on top surface 15 of printed circuit board 13. In addition, an electrical connector 25 is shown mounted on bottom edge 21 of printed circuit board 13. As can be appreciated, electrical connector 25 enables printed circuit board 13 to be electrically connected to and mechanically disposed within an electronic device, such as a computer.

Printed circuit board assembly 11 also comprises a socket 27 which is thruhole mounted on top surface 15 of printed circuit board 13. Socket 27 represents any electronic socket which can be mounted onto a standard printed circuit board. As can be seen, socket 27 comprises an open frame plastic insulator 29 and a plurality of low insertion force contact receptacles 30 which extend through insulator 29. Insulator 29 is generally rectangular in shape and includes a top end 31 and a bottom end 33, bottom end 33 being opposite top end 31. Top end 31 includes a plurality of integrally formed, downwardly curved, rigid fingers 35-1, 35-2 and 35-3, respectively. Similarly, bottom end 33 includes a plurality of integrally formed, downwardly curved, rigid fingers 37-1, 37-2 and 37-3, respectively. Each of low insertion force contact receptacles 30 in insulator 29 is shaped to enable the contact of an electronic component to be disposed therewithin using a low insertion force.

An electronic component 39 is mounted on socket 27. Electronic component 39 represents any electronic component which can be mounted on socket 27 and is preferably a integrated circuit (IC) chip, such as a Pentium Pro IC processor chip manufactured by Intel Corporation of Santa Clara, Calif. Electronic component 39 comprises a base 41, an integrated circuit (IC) chip package 43 disposed in base 41 and a plurality of contacts 44 which protrude out from base 41. IC chip package 43 is disposed in base 41 so that a top surface 45 of package 43 protrudes slightly above a top surface 46 of base 41.

The plurality of contacts on component 39 are in electrical connection with IC chip package 43 and are configured in the identical pattern in which contact receptacles 30 are configured on socket 27. As a result, electronic component 39 can be mounted onto socket 27 with one contact on component 39 extending into a corresponding receptacle 30 in socket 27 so as to electrically connect component 39 to socket 27.

It should be noted that although printed circuit board assembly 11 is shown comprising an electronic component 39 mounted on a socket 27 having fingers 35 and 37, it is to be understood that printed circuit board assembly 11 could alternatively comprise an electronic component having integrally formed fingers on the electronic component rather than on the socket, without departing from the spirit of the present invention.

Printed circuit board assembly 11 further comprises a heatsink assembly 47 mounted on electronic component 39, a pair of clips 49-1 and 49-2 for retaining heatsink assembly 47 onto electronic component 39 and a sheet metal handle 51 mounted on bottom surface 17 of printed circuit board 13 at top edge 19.

Heatsink assembly 47 is mounted on top surface 45 of electronic component 39 and serves to remove excess heat produced by electronic component 39, and more particularly IC chip package 43, during use. Heatsink assembly 47 is constructed of a highly conductive material and comprises a heatsink 53 and a heat pipe 55.

Heatsink 53 is an elongated, generally rectangularly-shaped body having a flat bottom surface 57, a flat top surface 59 and a central, generally cylindrically-shaped channel 61 formed in top surface 59. A pair of rectangularly-shaped clip recesses 63-1 and 63-2 are formed in top surface 59 on opposite sides of central channel 61. A first set of thin, elongated fins 65-1 and a second set of thin, elongated fins 65-2 are each formed on top surface 59 of heatsink 53 in closely spaced parallel relation. Fins 65-1 and 65-2 serve to assist in removing the heat received by heatsink 53 from electronic component 39. Heatsink 53 is preferably constructed of aluminum. However, it is to be understood that heatsink 53 could be constructed of any material which has a high level of thermal conductivity, such as a copper-tungsten alloy, aluminum nitride, beryllium oxide or copper, without departing from the spirit of the present invention.

Flat bottom surface 57 of heatsink 53 is sized and shaped to match the dimensions of top surface 45 of IC chip package 43. It should be noted that a thin layer of a thermally conductive material, such as a grease sealant or a heat conductive pad, may be disposed between heatsink 53 and IC chip package 43 to maximize the quality of contact, and consequently the heat transfer, between electronic component 39 and heatsink 53.

Heat pipe 55 is a generally cylindrical structure and is constructed of a conductive material, such as copper, to remove the heat received from heatsink 53. Heat pipe 55 comprises an evaporator section 67 and a condenser section 69. Evaporator section 67 and condenser section 69 are formed together to make heat pipe 55 an integral member, condenser section 69 having an enlarged free end 70. Evaporator section 67 is disposed within central cylindrical channel 61 of heatsink 53 and, using techniques which are well-known in the art, is subsequently expanded to draw evaporator section 67 of heat pipe 55 in tight thermal contact with heatsink 53. A plurality of thin, elongated fins 71 are mounted on condenser section 63 in closely spaced parallel relation and serve to assist in remove the heat received from heatsink 53. An end fin 71-1, which is disposed closest to enlarged free end 70 of condenser section 69, comprises a pair of outwardly extending screws 73-1 and 73-2.

Pair of clips 49-1 and 49-2 serve to retain heatsink 53 onto electronic component 39. Each clips 49-1 and 49-2 is unitary in construction and is manufactured using a strong and resilient material. Specifically, each of clips 49-1 and 49-2 is an elongated, generally C-shaped, spring-biased metal clip which comprises a first end 75, a second end 77 and a central member 79 which connects first end 75 to second end 77. First and second ends 75 and 77 of each of clips 49-1 and 49-2 are each shaped to include a mounting hole 81 and 83, respectively.

In use, clips 49-1 and 49-2 retain heatsink 53 onto electronic component 39 in the following manner. Specifically, first end 75 of clip 49-1 is positioned such that finger 35-1 on socket 27 protrudes through mounting hole 81, thereby lockably engaging first end 75 onto finger 35-1. Central member 79 of clip 49-1 is then positioned so as to extend longitudinally over clip recess 63-1 of heatsink 53. With clip 49-1 positioned as such, second end 77 of clip 49-1 is positioned such that finger 37-1 on socket 27 protrudes through mounting hole 83, thereby lockably engaging second end 77 onto finger 37-1 so that central member 79 of clip 49-1 applies a downward pressure onto heatsink 53 to force heatsink 53 down against electronic component 39, as desired. Similarly, first end 75 of clip 49-2 is positioned such that finger 35-3 on socket 27 protrudes through mounting hole 81, thereby lockably engaging first end 75 onto finger 35-3. Central member 79 of clip 49-2 is then positioned so as to extend longitudinally over clip recess 63-2 of heatsink 53. With clip 49-2 positioned as such, second end 77 of clip 49-2 is positioned such that finger 37-3 on socket 27 protrudes through mounting hole 83, thereby lockably engaging second end 77 onto finger 37-3 so that central member 79 of clip 49-2 applies a downward pressure onto heatsink 53 to force heatsink 53 down against electronic component 39, as desired.

Sheet metal handle 51 is mounted on bottom surface 17 of printed circuit board 13 at top edge 19 and serves three principal functions. Specifically, handle 51 can be used to lock printed circuit board assembly 11 in place within an electronic device, such as a computer, handle 51 can be used as a handle for holding printed circuit board assembly 11 and handle 51 can be used to lockably mount heatsink assembly 47 onto printed circuit board 13. Handle 51 is a generally L-shaped sheet metal plate and comprises a plurality of hexagonal openings 85 which align against fins 71 to enable cool air to be passed through fins 71. Handle 51 additionally comprises a large central aperture 87 and a pair of small openings 89-1 and 89-2 disposed on opposite sides of aperture 87. Central aperture 87 is sized and shaped to enable free end 70 of heat pipe 55 to be disposed therethrough. Pair of small openings 89-1 and 89-2 are sized and shaped to enable a corresponding screws 73-1 and 73-2, respectively, to be disposed therethrough and subsequently locked in place by a pair of nuts 91-1 and 91-2, respectively.

The embodiment shown in the present invention is intended to be merely exemplary and those skilled in the art shall be able to make numerous variations and modifications to it without departing from the spirit of the present invention. All such variations and modifications are intended to be within the present invention as defined in the appended claims.

What is claimed is:

1. A heatsink assembly for removing at least some of the heat produced by an electronic component during use, said heatsink assembly comprising:

(a). a heatsink, said heatsink comprising an elongated body having a bottom surface, a top surface, a pair of clip recesses formed in the top surface and a central channel, said central channel being formed in the top surface, (b). a heatpipe having an evaporator section and a condenser section, the evaporator section of said heatpipe being disposed tightly within the central channel of said heatsink so as to maximize the transfer of heat from said heatsink to said heatpipe, and (c). a plurality of fins mounted on the condenser section of said heatpipe.

2. The heatsink assembly of claim 1 wherein the pair of clip recesses are disposed on opposite sides of the central channel.

3. The heatsink assembly of claim 1 wherein said heatsink further comprises a plurality of fins formed on the top surface.

4. The heatsink assembly of claim 3 wherein the plurality of fins comprise a first set of thin, elongated fins disposed in closely spaced parallel relation and a second set of thin, elongated fins disposed in closely spaced parallel relation.

5. The heatsink assembly of clam 3 wherein said heatsink is constructed of a highly conductive material.

6. The heatsink assembly of claim 5 wherein said heatsink is constructed of aluminum.

7. The heatsink assembly of claim 6 wherein the central channel in said heatsink is generally cylindrically shaped.

8. The heatsink assembly of claim 7 wherein said heat pipe constructed of a conductive material such as copper.

9. A circuit board assembly comprising:

(a). a circuit board having a top surface and a bottom surface, (b). a socket mounted on the top surface of said circuit board, said socket having a first end and a second end, the first end having a pair of fingers, the second end having a pair of fingers, (c). an electronic component mounted on said socket, said electronic component having a top surface, and (d). a heatsink assembly for removing at least some of the heat produced by the electronic component during use, said heatsink assembly comprising, (i). a heatsink, said heatsink comprising an elongated body having a bottom surface, a top surface and a central channel, said central channel being formed in the top surface, the bottom surface of said heatsink being disposed on the top surface of said electronic component, (ii). a heatpipe having an evaporator section and a condenser section, the evaporator section of said heatpipe being disposed tightly within the central channel of said heatsink so as to maximize the transfer of heat from said heatsink to said heatpipe, and (iii). a plurality of fins mounted on the condenser section of said heatpipe.

10. The circuit board assembly of claim 9 wherein the heatsink in said heatsink assembly comprises a pair of clip recesses formed in the top surface.

11. The circuit board assembly of claim 10 further comprising a pair of clips for retaining the bottom surface of the heatsink tightly against the top surface of said electronic component so as to maximize the transfer of heat from said electronic component to the heatsink.

12. The circuit board assembly of claim 11 wherein one of said pair of clips is disposed within each of the pair of clip recesses in the heatsink.

13. The circuit board assembly of claim 12 wherein each of said pair of clips engages one of the pair of fingers on the first end of said socket and one of the pair of fingers on the second end of said socket.

14. The circuit board assembly of claim 13 wherein the top surface of the heatsink in said heatsink assembly is shaped to include a plurality of fins formed on the top surface.

15. The circuit board assembly of claim 14 wherein the plurality of fins formed on the top surface of the heatsink comprise a first set of thin, elongated fins disposed in closely spaced parallel relation and a second set of thin, elongated fins disposed in closely spaced parallel relation.

16. The circuit board assembly of claim 15 further comprising a handle mounted on said circuit board, said heatsink assembly being connected to said handle to help retain said heatsink assembly on said electronic component.

17. A heatsink assembly for removing at least some of the heat produced by an electronic component during use, said heatsink assembly comprising:

(a). a heatsink, said heatsink comprising an elongated body having a bottom surface, a top surface, a plurality of fins formed on the top surface and a central channel, said central channel being formed in the top surface, (b). a heatpipe having an evaporator section and a condenser section, the evaporator section of said heatpipe being disposed tightly within the central channel of said heatsink so as to maximize the transfer of heat from said heatsink to said heatpipe, and (c). a plurality of fins mounted on the condenser section of said heatpipe.

\* \* \* \* \*